United States Patent [19]

Min et al.

[11] Patent Number: 4,910,797

[45] Date of Patent: Mar. 20, 1990

[54] AUTOMATIC GAIN CONTROL SYSTEM

[75] Inventors: Sung-Ki Min, Inchon; Chan-Kyu Myung, Seoul; Jae-Shin Lee, Suwon, all of Rep. of Korea

[73] Assignee: Samsung Electronics Co., Ltd., Suweon, Rep. of Korea

[21] Appl. No.: 160,922

[22] Filed: Feb. 26, 1988

[30] Foreign Application Priority Data

Mar. 2, 1987 [KR] Rep. of Korea .................. 1987-1891

[51] Int. Cl.⁴ ............................................. H03G 3/20
[52] U.S. Cl. .................................... 455/249; 330/284; 381/108
[58] Field of Search .................. 375/98; 381/107, 108; 455/234, 235, 245, 249; 364/571, 573; 367/67, 65, 66; 330/278, 279, 284, 285; 323/283, 293, 297; 333/17 R, 17 L

[56] References Cited

U.S. PATENT DOCUMENTS

| | | | |
|---|---|---|---|
| 4,016,557 | 4/1977 | Zitelli et al. | 367/67 |
| 4,611,344 | 9/1986 | Hayama et al. | 381/108 |
| 4,670,719 | 6/1987 | Sakurai | 330/284 |
| 4,688,258 | 8/1987 | Kunugi et al. | 381/107 |
| 4,707,840 | 11/1987 | Nakayama | 375/98 |
| 4,731,851 | 3/1988 | Christopher | 330/284 |
| 4,779,055 | 10/1988 | Beauducel et al. | 367/67 |

*Primary Examiner*—Benedict V. Safourek
*Attorney, Agent, or Firm*—Robert E. Bushnell

[57] ABSTRACT

A digital automatic gain control system for maintaining a constant output level through attenuating or amplifying an input signal is disclosed. The system includes a gain control providing an output signal by amplifying or attenuating an input signal in a step mode in response to digital data of a data bus, a comparator deciding with a digital output whether or not said output signal is within a window reference voltage range, a stage preventing a malfunction due to noise by means of performing a counting operation upon receiving said digital output, a clock generating a clock pulse and dividing the frequency of the clock pulse, whereby there is provided a divided clock in case of performing an up counting operation and to the contrary there is provided the non-divided clock pulse in case of performing a down counting operation, and generating a reset clock delayed by a specified time interval from said clock, a latch adapted to receive and thereby latch an output of preventing stage malfunction, and reset clock and up-/down counting and logic performing the up or down counting operation by receiving said clock and a latch signal.

34 Claims, 10 Drawing Sheets

AUTOMATIC GAIN CONTROL SYSTEM

BACKGROUND OF THE INVENTION

The present invention relates to an automatic gain control system for maintaining a constant output level by attenuating or amplifying an input signal, and more particularly to a digital automatic gain control system.

As a prior automatic gain control system, there is provided a system which was disclosed in the 138th page of "Electronic Design" issued on Sept. 16, 1982. The prior automatic gain control system shown in FIG. 1, comprises a step gain controller 1 adapted to provide a variable gain control for controlling an output signal level in response to an input signal level from an input line 8, a buffer 2 adapted not to influence the step gain controller 1 upon any variation of signals through an output line 9, a rectifying detector means 10 for detecting and thereby outputting a constant direct-current (dc) voltage corresponding to a signal level on the output line 9, a window comparator 11 for providing a specified logic level by means of comparing said dc voltage with fixed reference voltages in both nodes 13 and 14 respectively divided from a dc supply voltage received in a reference voltage input terminal 12, a clock pulse generator 7 and a up/down counter 6 for performing an up or down counting operation and stopping the count upon receiving the logic output of said window comparator 11 and the clock pulse. Accordingly, when the signal level of the output line 9 goes over a specified level, the up/down counter 6 begins a down counting on the basis of a logic output of said window comparator 11, and when being on the contrary (i.e., below a specified level), it begins an up counting. However, when the signal level is within the range between two fixed levels, it stops the count. By these steps, the output signal level of the output line 9 can be constantly maintained in a specified range between the two levels.

However, the prior automatic gain control system as described hereinbefore is a semi-analog system because the rectifying detection means 10 operates by means of a lowpass filter including an amplifier 3, resistors R1 and R2, a diode D1 and a capacitor C1, as a rectifying detector. Also, in case that the frequency of the input signal from the input line 8 is high, it is impossible to achieve the system by making use of an universal operational amplifier because of the limitation in slew rate of the operational amplifier. Further, because the rectifying detection means 10 detects a maximum value of input signals during charging and discharging with a charging time constant R1C1 and a discharging time constant R2C1, it becomes impossible to carry out a stable operation unless an adequate time constant is arranged in accordance with the frequency of input signal. Furthermore, when impulse noises are included in the input signal, the aforementioned automatic gain control system fails to improve the noise problem because the maximum value of noise is detected and the maximum value is used to control gain of the amplifier.

SUMMARY OF THE INVENTION

It is therefore an object of the invention to provide an automatic gain control system which enables maintenance of an output signal level at a constant level within a fixed range even for an input signal having a high frequency.

It is another object of the invention to provide an automatic gain control system in which a malfunction of the system does not arise even if impulse noise is included in an input signal.

A still further object of the invention is to provide a digital automatic gain control system which is adequate to achieve a system integration.

These and other objects of the invention are achieved in a digital automatic gain control system which comprises gain control means adapted to provide an output signal by means of amplifying or attenuating an input signal in step mode in response to digital data of a data bus, comparing means for deciding with a digital output whether or not said output signal is within a window reference voltage range, means for preventing a malfunction due to noise by performing a counting operation on the basis of the digital output, means for generating a clock pulse and dividing in frequency the clock pulse, whereby there is provided a divided clock pulse in case of performing an up counting operation and to the contrary there is provided the non-divided clock pulse in case of performing a down counting operation, and generating a reset clock signal delayed by a specified time interval from said clock, latch means adapted to receive and thereby latch an output of said means for preventing a malfunction, a reset clock and up/down counting and logic means for performing the up or down counting operation by receiving said clock and a latch signal.

BRIEF DESCRIPTION OF THE DRAWINGS

The features and advantages of the system according to the invention will now be described hereinafter with reference to the accompanying drawings, wherein.

DETAILED DESCRIPTION OF A PREFERRED EMBODIMENT

Figure 1:
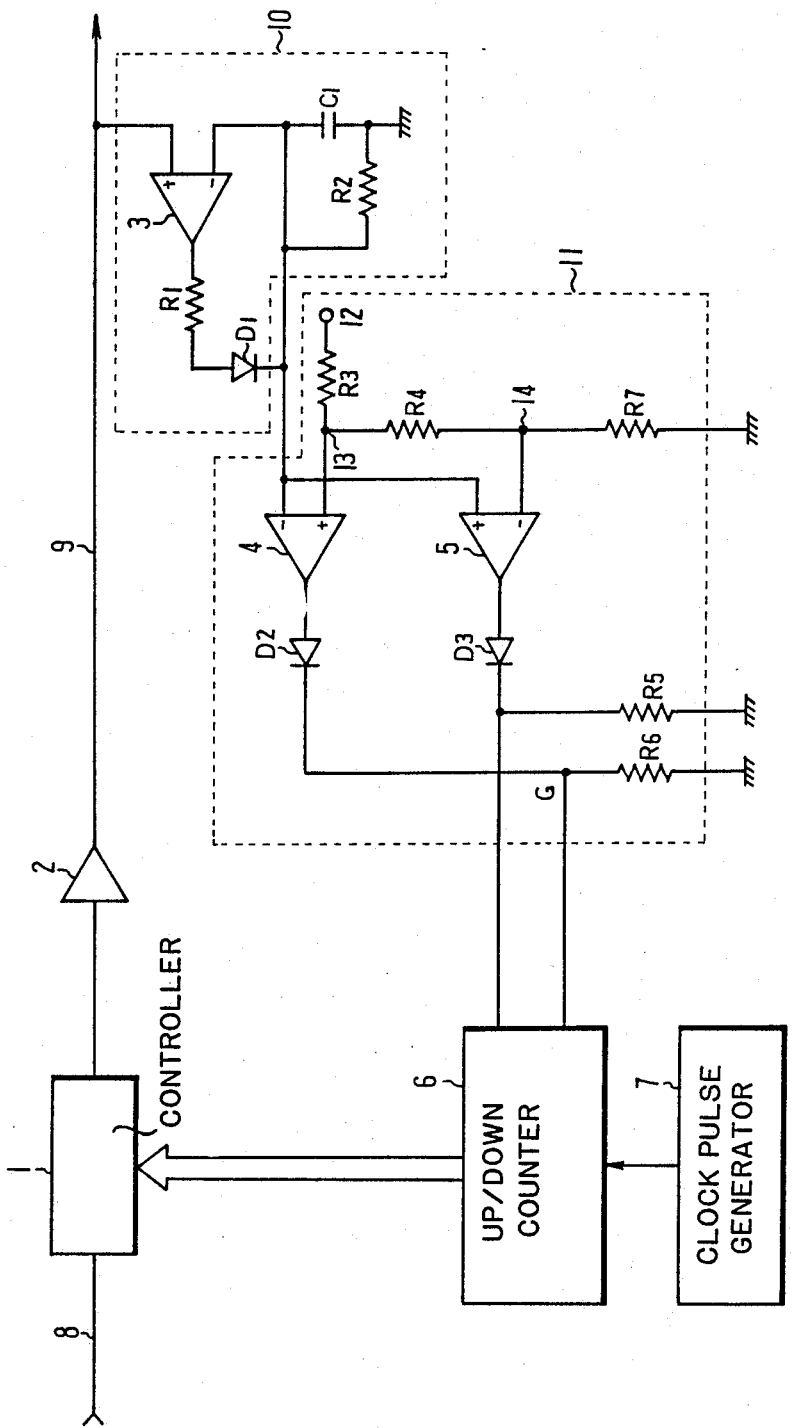
FIG. 1 is a schematic circuit diagram showing an automatic gain control system of prior art.
Figure 2:
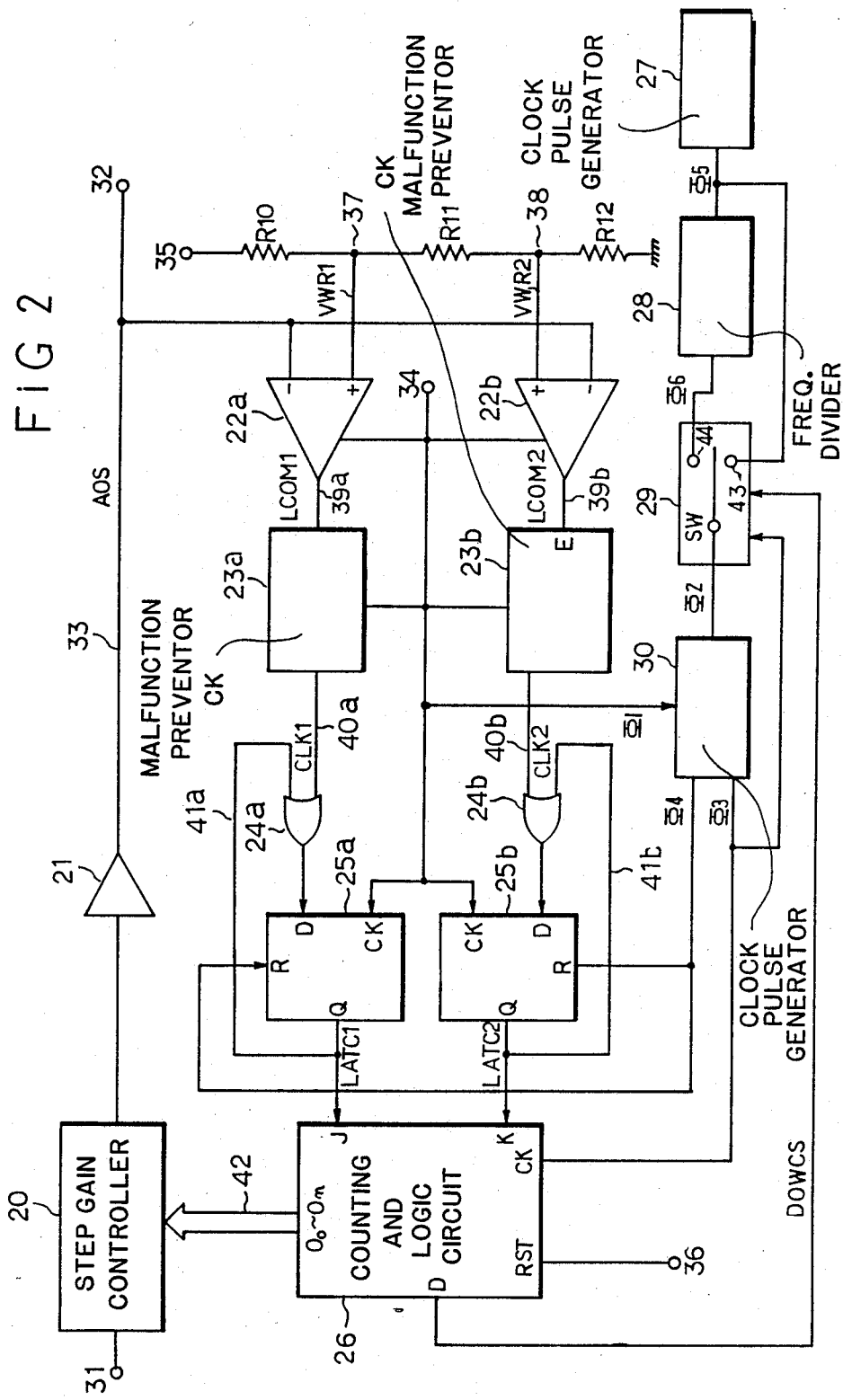
FIG. 2 is a block diagram in accordance with the invention.

FIG. 2 shows a block diagram of a preferred embodiment of an automatic gain control system in accordance with the invention. A step gain controller 20 amplifies and attenuates in a step mode an input signal delivered through an input terminal 31, and receives through a data bus 42 digital data of a plurality of bits provided by an up/down counting and logic circuit 26 which will be described hereinafter. Accordingly it should be noted that the step gain controller 20 operates as a variable gain controller for supplying a fixed output signal level and there may be used a conventional digital-to-analog converter. Since a voltage follower with an usual unit gain may be employed as a buffer 21, it should be also noted that the buffer is arranged so that the step gain controller 20 is not affected in operation by the variation of signals in an output line 33. The output signal of output line 33 is fed to inverting inputs (−) of a pair of latching comparators 22a and 22b which form a window comparator. Resistors R10, R11 and R12 are connected in series between a terminal 35 for applying a dc reference voltage Vref and a ground. Window reference voltages VWR1 and VWR2 divided at connection points 37 and 38 of said resistors are respectively fed to non-inverting inputs (+) of said comparators 22a and 22b. To the comparators 22a and 22b is fed a sampling clock $\Phi1$ of 10 to 40 MHz, wherein the comparators compare the output signal level of the output line 33 with said window reference voltages VWR1 and VWR2 in an up or down edge of said sampling clock, and thereby respectively generate output logic signals LCOM1 and LCOM2 through lines 39a and 39b.

Consequently, referring to the embodiment of FIG. 2, if the output signal level of the line 33 is larger than the window reference voltage VWR1, both the logic outputs LCOM1 and LCOM2 become a logic low level "0". If the output signal level is smaller than the window reference voltage VWR2, both the logic outputs LCOM1 and LCOM2 become a logic high level "1", and if said output signal level is between the window reference voltages VWR1 and VWR2, then the logic output LCOM1 becomes the logic "1" and the logic output LCOM2 becomes the logic "0". Logic outputs LCOM1 and LCOM2 are respectively delivered to each input terminal E of a pair of noise-malfunction preventing means 23a and 23b, and said sampling clock $\Phi$ is also delivered to the clock input CK of preventing means 23a, 23b. Output lines 40a and 40b of the noise-malfunction preventing means are each connected to OR gates 24a and 24b.

Figure 3:
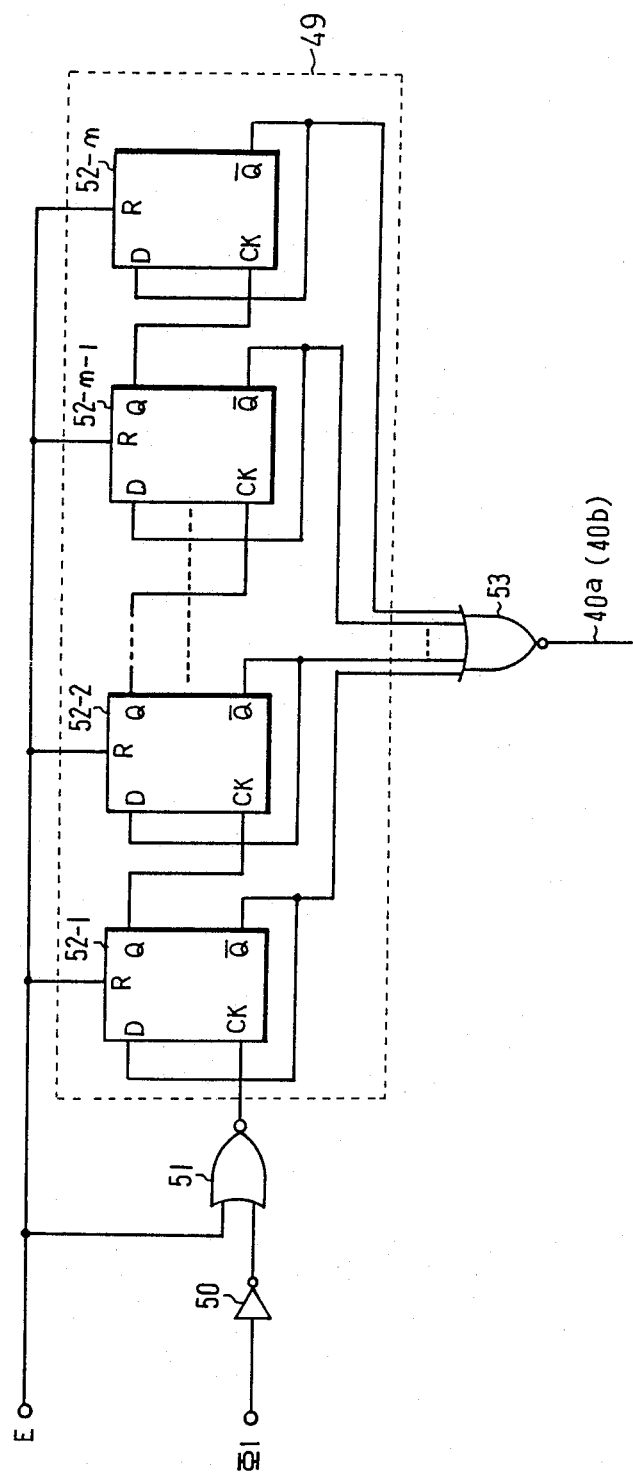
FIG. 3 is a detailed circuit diagram showing an embodiment of a noise-malfunction preventing means in FIG. 2.

Both noise-malfunction preventing means 23a and 23b have circuit configurations identical to each other, the detailed circuit diagram of which are shown in FIG. 3, and said logic signals LCOM1 and LCOM2 are entered into each reset input terminal R of n-bit binary ripple counter 49 having a series of D-type flip-flops 52-1, 52-2 . . . and 52-n through the input terminal E, and at the same time, into a NOR gate 51. The sampling clock $\Phi1$ is entered into said NOR gate 51 through an INVERTER 50, and the output of NOR gate 51 is coupled to a clock input terminal CK of the first-staged D-type flip-flop 52-1 of said binary ripple counter 49. An output terminal Q of any one of said D-type flip-flops is connected to a clock input terminal CK of a next-staged flip-flop, and then each data input terminal D and each output terminal $\overline{Q}$ of all the flip-flop are connected in common to another NOR gate 53. Therefore the noise-malfunction preventing means shown in FIG. 3 resets said n-bit binary ripple counter 49 and thereby provides the logic low signal "0" through output lines 40a and 40b of output NOR gate 53 in the case that the signal level of said line 33 is lower than that of the window reference voltage VWR2, wherein the signals LCOM1 and LCOM2 are in logic high level "1". When the signal level of said line 33 is larger than the window reference voltage VWR1, wherein the signals LCOM1 and LCOM2 are in logic low level "0", the noise-malfunction preventing means 23a and 23b delivers the sampling clock $\Phi1$ to the first-staged D-type flip-flop 52-1 of said n-bit binary ripple counter 49 and generates pulse signals CLK1 and CLK2 corresponding to one period of said sampling clock $\Phi1$ through said output lines 40a and 40b at every $(2^n-1)$th time of counting. When the signal level of said line 33 is in the range between the window reference voltages VWR1 and VWR2, the noise-malfunction preventing means 23b provides the pulse signal CLK2 by operating said counter 49 and the other noise-malfunction preventing means 23a maintains a logic low level "0" as the pulse signal CLK1 by resetting said counter 49.

Accordingly, when the signal level of said line 33 goes higher than the window reference voltage VWR1 as any impulse noises are mixed in the signals of said line 33, the n-bit binary ripple counters 49 of said noise-malfunction preventing means 23a and 23b perform a counting operation. Then, if the signal of said line 33 falls to a voltage between the window reference voltages VWR1 and VWR2 while counting $2^n-1$ times, the noise-malfunction preventing means 23a stops its counting, resets and thereby changes its output CLK1 into a logic level "0", whereas the other noise-malfunction preventing means 23b continues its counting until the count will reach $2^n-1$ times, thereby providing the pulse signal CLK2. If the signal of said line 33 becomes lower than the window reference voltage VWR2 while counting $2^n-1$ times, both noise-malfunction preventing means 23a and 23b reset. Thus the outputs CLK1 and CLK2 become logic level "0". If bit number n is arranged so that n-bit binary ripple counter performs the counting operation during a period of time which is longer than that of a maximum pulse width of the noise signal, the malfunction due to the noise will be well prevented thereby.

Referring again to FIG. 2, output signals CLK1 and CLK2 delivered by said noise-malfunction preventing means 23a and 23b are respectively entered to OR gates 24a and 24b along with output signals of output terminals Q of D-type flip-flops 25a and 25b, each of which makes up a latch circuit, outputs of OR gates 24a and 24b are respectively entered at inputs D of said D-type flip-flops 25a and 25b, and also the sampling clock $\Phi1$ is fed to their clock inputs CK as a clocking pulse. A reset clock $\Phi4$ is fed to their reset inputs R in order to reset said latch circuit. Therefore, the latch circuit is latched to logic states of the signals CLK1 and CLK2 of lines 40a and 40b by clocking of the sampling clock $\Phi1$ and there are provided output signals LATC1 and LATC2 through the output terminals Q of said D-type flip-flops 25a and 25b, which are reset by a reset clock $\Phi4$ as described hereinafter, said output signals LATC1 and LATC2 are respectively entered to inputs J and K of an up/down counting and logic circuit 26, in which a reset signal is also fed through its reset input terminal 36 to thereby reset all n-bit output terminals Q0–Qn. A clock pulse $\Phi3$ is also entered to clock input terminal CK and an up or down counting or a stop operation is made in accordance with logic states in said inputs J and K.

Figure 4:
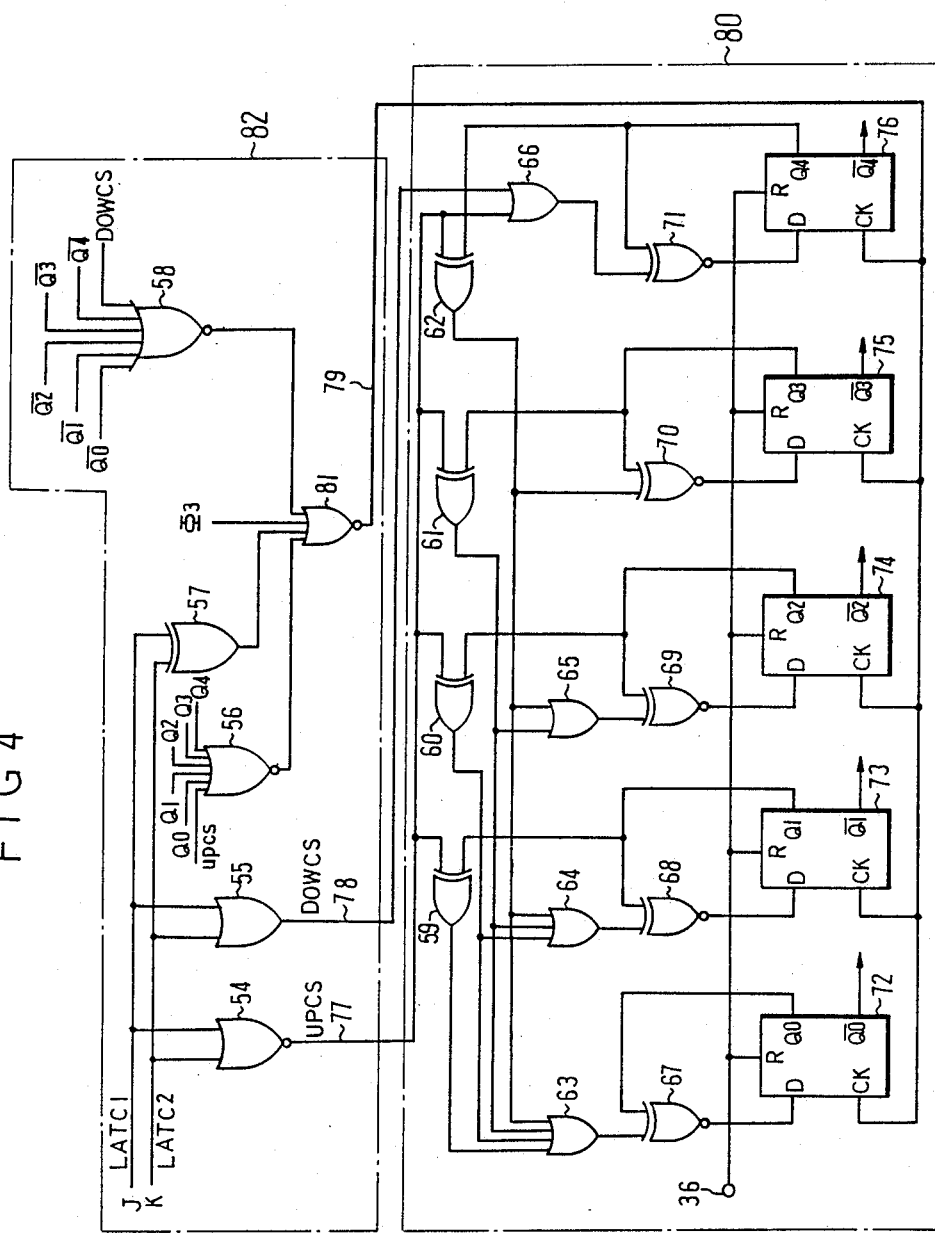
FIG. 4 is a detailed circuit diagram showing an embodiment of an up/down counting and logic circuit in FIG. 2.

FIG. 4 shows a detailed circuit diagram of the up/down counting and logic circuit 26, which comprises a logic circuit 82 having NOR gate 54 and or gate and 55 for each providing an UP count control signal UPCS and a DOWN count control signal DOWCS after respectively receiving signals LATC1 and LATC2 through input terminals J and K, an EXCLUSIVE-OR gate 57, a NOR gate 56 for informing an end of DOWN counting upon receiving said output signal UPCS of NOR gate 54 and output data signals Q0-Q4 of an 5-bit UP/DOWN counter 80, a NOR gate 58 for informing an end of UP counting in response to reception of ouput signal DOWCS of OR gate 55 and output data signals $\overline{Q0}$-$\overline{Q4}$ of said 5-bit UP/DOWN counter 80, and then a NOR gate 81 for receiving a counting clock Φ and outputs of said NOR gates 56, 58 and said EXCLUSIVE-OR gate 57 and thereby providing or not providing said counting clock Φ3 upon the UP or DOWN counting in response to the received signals; and an UP/DOWN counter 80 which receives the clock Φ3 delivered by the NOR gate 81 upon the UP or DOWN counting as a counting clock, takes the UP counting in the case that said output signal UPCS of NOR gate 54 is logic level "1", and then takes the DOWN counting in the case that said output signal DOWCS of OR gate 55 is logic level "1". Said UP/DOWN counter 80 may use a conventional UP/DOWN counter and resets all the output data by a reset signal provided through a reset terminal 36. 5-bit data outputs Q0-Q4 each provided from output terminals of D-type flip-flops 72 to 76 control a gain of the step gain controller 20 through the data bus 42, as shown in FIG. 2.

Figure 5:
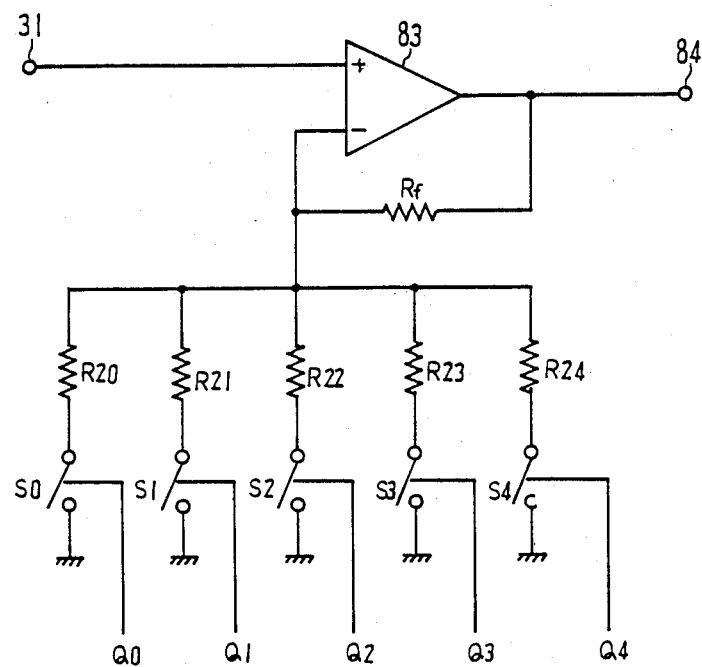
FIG. 5 is a schematic circuit diagram showing an embodiment of a step gain controller in FIG. 2.

Switches S0 to S4 of the step gain controller 20 perform ON/OFF operations in response to the data signals Q0 to Q4 delivered through the data bus 42 as shown in FIG. 5. Therefore, the step gain controller may be a non-inverting amplifier circuit comprising an operational amplifier 83, a feedback resistor Rf and resistors R20-R24. When the data signals Q0-Q4 are all logic level "0", all the switches S0-S4 become OFF and thereby the non-inverting amplifier has a unit gain of "1", wherein the input through an input terminal 31 is delivered to an output line 84 as it is. As the switches are selectively driven to ON or OFF in sequence, the gain increases in a step mode.

A clock pulse generator 27 shown in FIG. 2 is a conventional circuit for generating a clock pulse, for which there is employed a RC relaxation oscillator to generate a clock pulse Φ5 of 60 Hz. The clock pulse Φ5 is delivered to a selector 29 and at the same time, another clock pulse Φ6 which is divided in a frequency divider 28 is also delivered to the selector 29. To the selector 29 are entered the DOWN count control signal DOWCS through an output line 78 of the OR gate 55 shown in FIG. 4 and the counting clock Φ3. When said UP/DOWN counter 80 carries out the DOWN counting, the switch SW of said selector 29 is coupled with a terminal 43 thereof, but when it does not take the DOWN counting, said switch is coupled to another terminal 44. Accordingly, the output clock Φ2 of said selector 29 corresponds to the clock Φ5 on the DOWN counting, but it corresponds to the frequency-divided clock Φ6 outside the DOWN counting.

Figure 6:
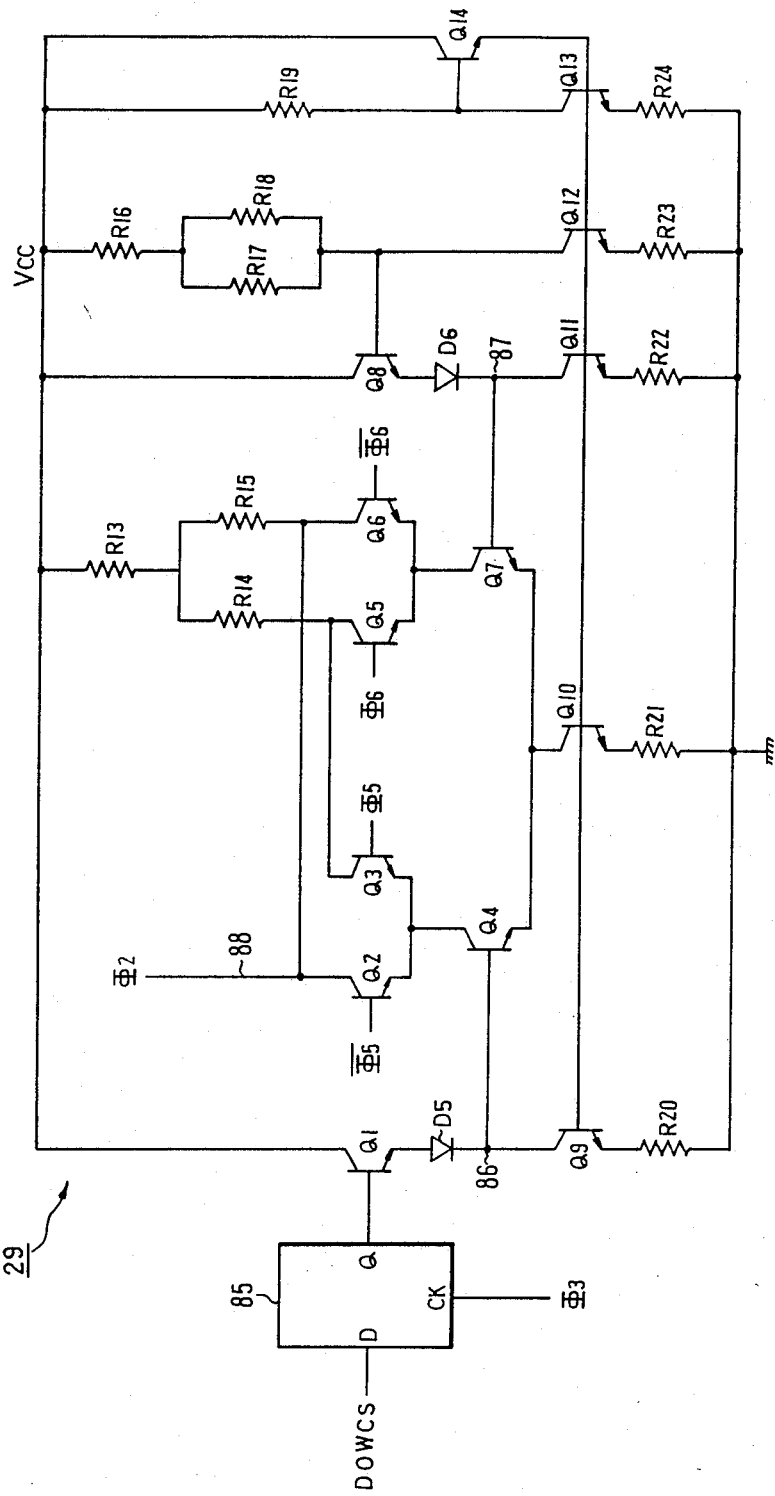
FIG. 6 is a schematic circuit diagram of a selector in FIG. 2.

FIG. 6 shows a detailed circuit diagram of said selector 29, wherein an input terminal D of D-type flip-flop 85 receives a DOWN count control signal DOWCS delivered from the OR gate 55 of the logic circuit 82 in FIG. 4, a clock input CK of the flip-flop 85 receives a counting clock Φ3 provided by a clock pulse generating and delaying circuit 30, and its output terminal Q is coupled with a base of transistor Q1. The clock pulse generating and delaying circuit generates the counting clock Φ3, which is fedback therein, and a reset clock Φ4. A collector of the transistor Q1 is connected to a source supply voltage Vcc(+5 volts) and its emitter is connected through a diode D5 to a base of a transistor Q4 and also to a collector of a transistor Q9 which operates as a current source. To bases of a pair of transistors Q2 and Q3 which form one differential amplifier are respectively fed the clock signals $\overline{Φ5}$ and $\overline{Φ5}$, and emitters of said transistors Q2 and Q3 are coupled together with a collector of the transistor Q4. To collectors of a pair of transistors Q5 and Q6 which form another different amplifier are respectively connected load resistors R14 and R15 which are in common connected to the source supply voltage Vcc through a resistor R13. A clock Φ6 and its inverted clock $\overline{Φ6}$ are respectively fed to each base of said transistors Q5 and Q6, and their emitters are in common connected to a collector of a transistor Q7. Emitters of said transistors Q4 and Q7 are in common connected to a collector of a transistor Q10 which operates as a current source. To a base of said transistor Q7 is coupled a bias supplying circuit comprising transistors Q8 and Q11 to Q14, resistors R16 to R19 and R22 to R24, and a diode D6, thereby supplying a constant direct-current(dc) voltage of about 3.4 volts at a node 87 as a preferred embodiment according to the invention (herein, there is provided 4.8 volts to a base of the transistor Q8).

Accordingly, the D-type flip-flop 85 having an emitter-coupled-logic (ECL) provides a logic "1" (5 volts) signal on the UP or DOWN edge of the clock Φ3 and maintains a node 86 in a voltage of 3.6 volts, when the input signal DOWCS is a logic "1" signal (herein, the UP/DOWN counter 80 performs the down counting). Thus, the transistor Q4 turns ON and the transistor Q7 turns OFF, by which the clock Φ2 corresponds to the clock Φ5 which is an inverted signal of the clock $\overline{Φ5}$ in an output line 88, that is, the collector of said transistor Q2. In the meanwhile, when the input signal DOWCS is a logic "0" signal, that is 4.6 volts, (herein, the UP/DOWN counter 80 does not perform the down counting), said node point 86 becomes to 3.2 volts, thereby turning OFF the transistor Q4 and turning ON the transistor Q7. Therefore, the transistors Q5 and Q6 operate, by which the clock Φ6 is provided at the output line 88 making the clock Φ2 equal to the clock Φ6. The clock pulse generating and delaying circuit 30 of FIG. 2 receives the clock Φ2 delivered from the selector 29 and performs a clocking operation in response to the sampling clock Φ1, by means of which the counting clock Φ3 and the reset clock Φ4 are provided in delay of a specified time.

Figure 7:
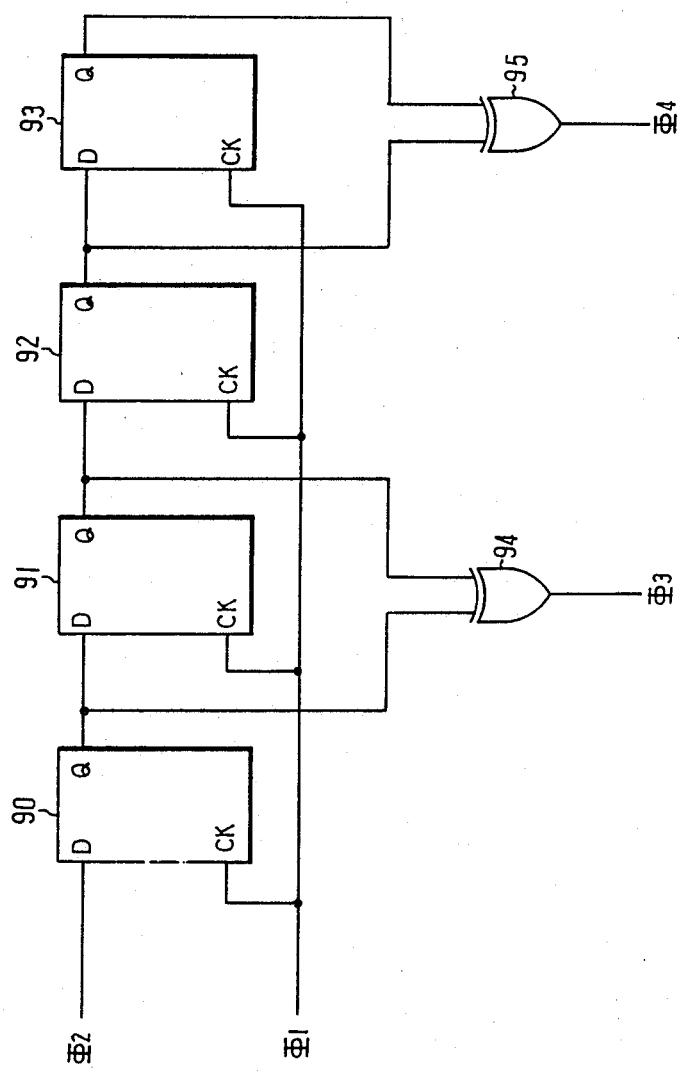
FIG. 7 is a detailed circuit diagram of a waveform-shaping and delaying means in FIG. 2.

FIG. 7 shows a detailed circuit diagram of said clock pulse generating and delaying circuit 30. The circuit comprises four D-type flip-flops 90 to 93 for performing a period delaying operation on the clock Φ1, wherein each output A is coupled in series connection to each input D of a next flip-flop and the sampling clock Φ1 enters each clock input CK; an EXCLUSIVE-OR gate 94 for providing the counting clock Φ3 which becomes a period of pulse of said clock Φ1 in an up or down edge of said input clock Φ2, wherein said EXCLUSIVE-OR gate receives outputs of said D-type flip-flops 90 and 91; and an EXCLUSIVE-OR gate 95 for providing the reset clock Φ4 whose timing is delayed by two periods of the clock Φ1 more than that of said counting clock Φ3, wherein said EXCLUSIVE-OR gate receives outputs of said D-type flip-flops 92 and 93. Accordingly, said counting clock Φ3 becomes a clock input for the UP/DOWN counter 80 and said reset clock Φ4 is delivered to reset inputs R of two D-type flip-flops 25a and 25b which form latching means in FIG. 2.

Hereinafter, the operation of the preferred embodiment according to the invention will be described in detail with reference to the timing diagram of FIG. 8. At an initial stage of operation, it is assumed that the clock $\Phi 2$ corresponds to the clock $\Phi 6$ (30 Hz) supplied from the frequency divider 28 by means of switching the switch SW in the selector 29 to the contact terminal 44, and also a level of output AOS in said output line 33 is lower than, the window reference voltage VWR2. The latching comparators 22a and 22b which form a window comparator, sample the output AOS by the sampling clock $\Phi 1$ and respectively compare said output with window reference voltages VWR2 and VWR1. Thus, the outputs LCOM1 and LCOM2 become logic level "1" as shown in a time interval T1 of FIG. 8. The clock generating and delaying circuit 30 provide the clock pulse $\Phi 3$ having a pulse width amounting to one period of said sampling clock $\Phi 1$ on an up or down edge of the clock $\Phi 2$ (30 Hz), and also provide the reset pulse $\Phi 4$ which delays in phase by two periods of the clock $\Phi 1$ more than that of counting clock pulse $\Phi 3$. The outputs LCOM1 and LCOM2 of said latching comparators 22a and 22b respectively are fed into the inputs E of the noise-malfunction preventing means 23a and 23b. As the noise-malfunction preventing means 23a and 23b receive the logic level "1" signals LCOM1 and LCOM2, and then there are reset all the flip-flops 52-1 to 52-n within the n-bit binary ripple counter 49, the outputs CLK1 and CLK2 become all logic level "0". To the OR gates 24a and 24b are each fed the signals LATC1 and LATC2 which are set in a logic level "0" by said reset clock $\Phi 4$, and said signals CLK1 and CLK2. Logic level "0" outputs of the OR gates are fed to inputs D of the D-type flip-flops 25a and 25b, and by the sampling clock $\Phi 1$, there are provided the signals LATC1 and LATC2 all latched to the logic level "0" at the Q terminals of flip-flops 25a, 25b. Said logic level "0" signals LATC1 and LATC2 are applied to the inputs J and K of the UP/DOWN counting and logic circuit 26. Therefore, an output UPCS of the NOR gate 54 in the logic circuit 82 becomes a logic level "1" and an output DOWCS of the OR gate 55 becomes a logic level "0". Said signal DOWCS enters to an input D of the D-type flip-flop 85 shown in FIG. 6, which forms a part of the selector 29, with counting clock $\Phi 3$ applied to the clock terminal CK. The output Q is latched to a low state (4.6 volts). Accordingly, a voltage in the node 86 becomes lower than a voltage in the node 87, the transistor Q4 becomes OFF and then the transistor Q7 becomes ON, thereby making the clock $\Phi 2$ of the output line 88 equal to the clock $\Phi 6$ of 30 Hz. Therefore, the switch SW of the selector 29 continues to be connected with the contact point 44 and the clock generating and delaying circuit 30 continuously provides the clock $\Phi 3$ and the reset clock $\Phi 4$ on an UP or DOWN edge of the 30 Hz clock $\Phi 2$.

In the meanwhile, said clock $\Phi 3$ is applied to the NOR gate 81 which forms a part of the logic circuit 82 shown in FIG. 4. In the case that the UP/DOWN counter 80 does not perform a full counting, there is provided through an output line 79 of the NOR gate 81 an inverted clock $\overline{\Phi 3}$ of said counting clock $\Phi 3$ which results from a logic level "0" output of the NOR gates 56 and 58, and a logic level "0" output of the EXCLUSIVE-OR gate 57. With receiving said clock $\overline{\Phi 3}$, the UP/DOWN counter 80 undertakes an UP counting operation. Therefore, the outputs Q0–Q4 of the 5-bit UP/DOWN counter 80 become a binary output increased by "1" on a down edge of the counting clock $\Phi 3$ shown in FIG. 8 and then are delivered to data bus 42. The step gain controller 20 provides through the output line 33 the output amplified by 1 step.

Figure 8:
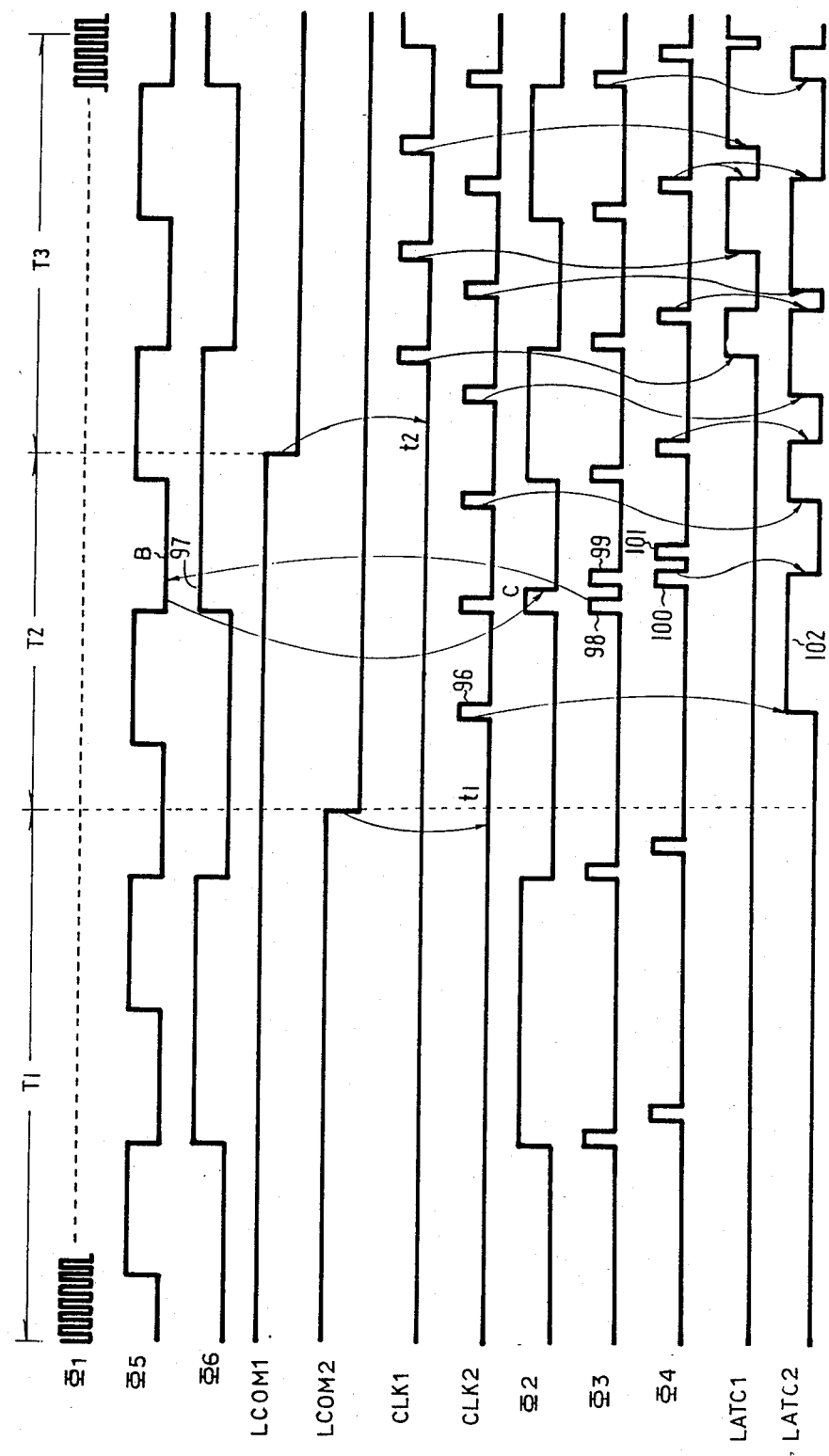
FIG. 8 is a timing diagram showing each aspect of operation in FIG. 2.

If the signal level of said output line 33 increases to come in the range between the window reference voltages VWR1 and VWR2, the outputs LCOM1 and LCOM2 of the latching comparator 22a and 22b respectively become a logic level "1" (HIGH) and a logic level "0" (LOW) as shown in a time interval T2 of FIG. 8. By the HIGH level signal LCOM1, the n-bit binary ripple counter 4 of the noise-malfunction preventing means 23a is reset and the signal CLK1 of line 40a becomes LOW. Thus, to a LOW state is latched the output LATC1 of the D-type flip-flop 25a which forms a latching circuit.

By applying a LOW signal LCOM2, the n-bit binary ripple counter 49 of the noise-malfunction preventing circuit 23b initiates the counting operation from the timing point t1 in which said signal LCOM2 becomes LOW, with the clock $\Phi 1$ received through a clock pulse input CK. Consequently, there are continuously provided the pulse CLK2 corresponding to one period of said clock $\Phi 1$ whenever counting the clock $\Phi 1$ $(2^n-1)$ times from the time t1 to a time that said signal LCOM2 maintains LOW. A pulse 96 of the signals CLK2 shown in FIG. 8 enters to the D-type flip-flop 25b through the OR gate 24b and the output signal LATC2 is latched to HIGH state by clocking of the clock $\Phi 1$. The LOW state output LATC1 and the HIGH state output LATC2 of the latch circuits 25a and 25b respectively enter to the input terminals J and K of the logic circuit 82 shown in FIG. 4, wherein the output UPCS of the NOR gate 54 becomes LOW and the output DOWCS of the OR gate 55 becomes HIGH.

The HIGH output signal DOWCS is delivered to the D-type flip-flop 85 having an ECL configuration and forming a part of the selector 29 shown in FIG. 6, and the clock $\Phi 3$ 93 which is taken as feedback in the clock generating and delaying circuit 30 by the 30 Hz clock 97 of FIG. 8 is also delivered to the clock input CK thereof. By these, a HIGH output is provided at the output terminal Q of said D-type flip-flop 85. As a result, as a voltage in the node 86 becomes higher than a voltage in the node 87, the transistor Q4 goes ON and the transistor Q7 goes OFF. Accordingly, the output signal $\Phi 2$ of the line 88 changes from the 30 Hz clock $\Phi 6$ to a 60 Hz clock $\Phi 5$. Because said clock $\Phi 5$ at this time is in LOW state like a point B shown in FIG. 8, the clock $\Phi 2$ goes to a LOW state at a point C and also a pulse 99 outputs as the clock $\Phi 3$ in the clock generating and delaying circuit. There is thus provided the reset pulse $\Phi 4$ with pulses 100 and 101 delayed from said pulse 98 and 99, and said pulse 100 resets the D-type flip-flop 25b shown in FIG. 2, thereby changing the signal LATC2 LOW from HIGH like a portion 102. When the signal LCOM2 becomes LOW, the output clock of the selector 29 is provided in the clock $\Phi 2$ coming from the 60 Hz clock $\Phi 5$, a pulse amounting to one period of the clock $\Phi 1$ is provided in the counting clock $\Phi 3$ on the up and down edge of the 60 Hz clock $\Phi 2$, and then the reset signal $\Phi 4$ delayed by one period of the clock $\Phi 1$ from the clock $\Phi 3$ outputs from the clock generating and delaying circuit 30.

When the counting clock $\Phi 3$ goes HIGH, the UP/DOWN counter performs its counting operation. Because the signal LATC1 is LOW and the signal LATC2 is HIGH in the timing interval T2 when the counting clock $\Phi 3$ goes HIGH, the output of the EXCLUSIVE-OR gate 57 in the logic circuit 82 becomes HIGH and the output of the NOR gate 81 becomes LOW. Thus, there is not provided the counting clock Φ3 on the line 79 and the UP/DOWN counter 80 does not take the counting operation, whereby there is not provided a gain variation of the step gain controller 20.

When the level of output signal AOS in the line 33 becomes higher than that of the window reference voltage VWR1 as the level of input signal through the input terminal 31 increases, all the outputs LCOM1 and LCOM2 of the latching comparator 22a and 22b become LOW as a time interval T3 shown in FIG. 8. Thus, the noise-malfunction preventing circuit 23a provides a clock pulse train CLK1 amounting to 1 period of said clock Φ1 from a timing point t2 that said signal LCOM1 becomes LOW, whenever counting the clock Φ1 ($2^n-1$) times. If said clock pulse train CLK1 becomes HIGH, the D-type flip-flop 25a is clocked by the clock Φ1 and the output LATC1 of the output terminal Q becomes HIGH. Then, the output LATC1 is reset at the down edge of the clock Φ4. In the same manner as above described, the another D-type flip-flop 25b outputs HIGH when the signal CLK2 becomes HIGH, and generates the signal LATC2 which will be reset by said clock Φ4. As all the signals LATC1 and LATC2 to be applied to the UP/DOWN counting and logic circuit 26 become HIGH when the input clock Φ3 is in a HIGH state, the output DOWCS of the OR gate 55 shown in FIG. 4 becomes HIGH, the output UPCS of the NOR gate 54 becomes LOW and then the output of the EXCLUSIVE-OR gate 56 becomes LOW. Thus, the output of NOR gate 81 becomes the clock Φ3 and the UP/DOWN counter 80 performs the down counting with the clock Φ3.

Said output signal DOWCS and the clock Φ3 enter to the selector 29 shown in FIG. 6 and the output of the D-type flip-flop 85 continuously maintains the state latched to "HIGH" signal. As aforementioned, the clock Φ2 provided in the output line 88 corresponds to the 60 Hz clock not divided by 2 and the clock Φ3 continuously generates a pulse train amounting to one period of the clock Φ1 on the up and down edge of said clock Φ5. Therefore, the data Q0–Q4 of the data bus 42 are provided with the decrease by one as performing the down counting at every HIGH state of the clock Φ3 in the time period T3 and thereby the step gain controller 20 attenuates its gain, which controls the output signal AOS of the line 33 so that it is kept up between the reference voltages VWR1 and VWR2. Thus, if the output level comes to the range between the voltages VWR1 and VWR2, the counting condition becomes the same as during the time period T2 shown in FIG. 8, and then the counting operation stops. If the output level is not made to become lower than the voltage VWR1 even in the full counting, the UP/DOWN counter continues to count. To prevent this, there is used the NOR gate 56. If the outputs Q0–Q4 become all LOW, the output of the NOR gate 56 becomes HIGH and then it does not pass the counting clock Φ3. Therefore, the counting operation stops.

Herein, the range between the window reference voltages VWR1 and VWR2 stops the automatic gain control (AGC) operation; the smaller the range becomes, the more constant the maximum level of the signal AOS in the output line 33 is maintained. However, if said window range becomes smaller than the width of level variation by one step in the step gain controller 20, there arises a case that the maximum level of said output signal AOS is not kept up within said window range, in which situation the output signal could not be maintained in a constant level. Consequently, said range of the window reference voltages should be made to be larger than the width of level variation by one step in the step gain controller 20.

Figure 9:
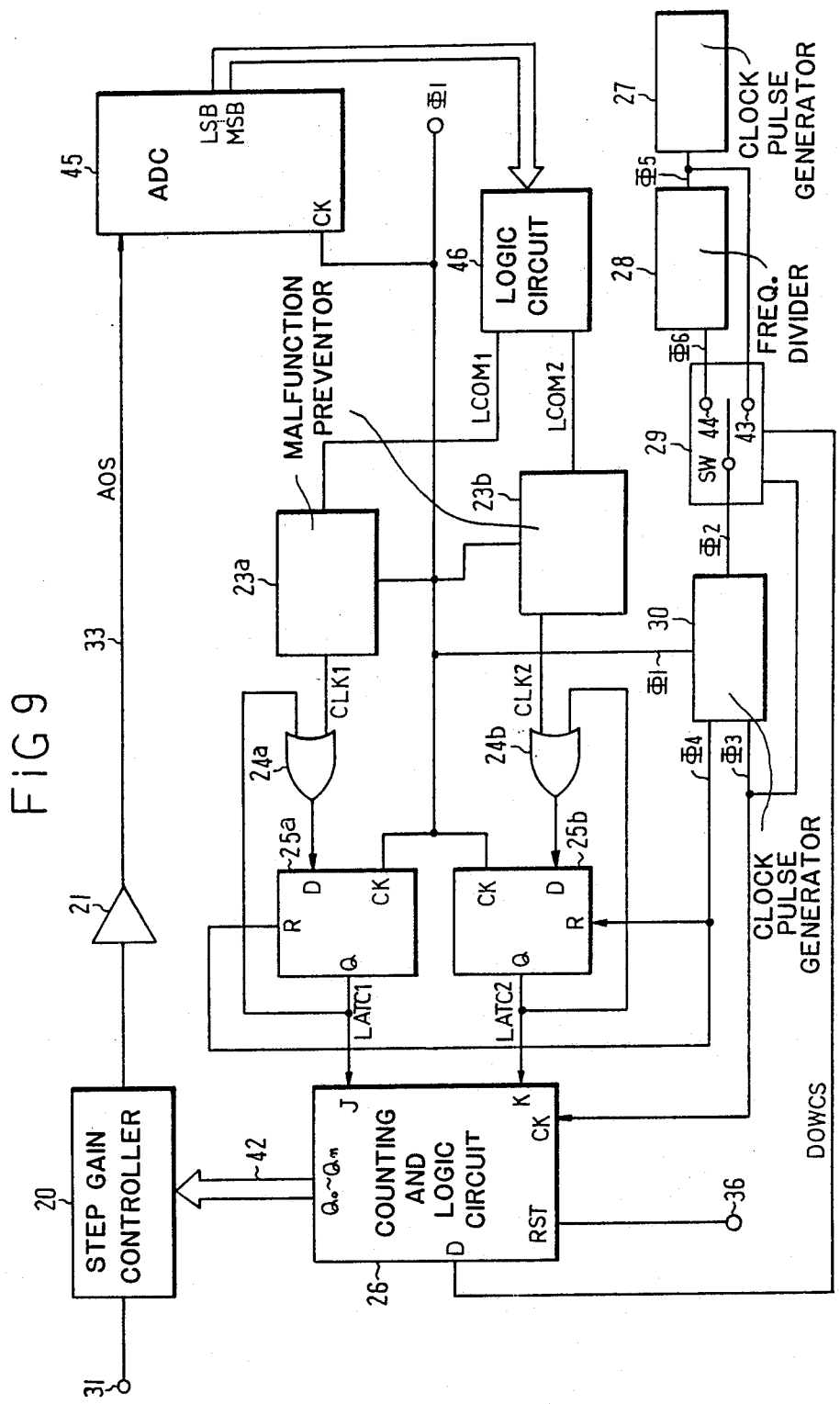
FIG. 9 is a schematic circuit diagram showing another embodiment of the invention.

Referring to FIG. 9, which shows a schematic circuit diagram of another embodiment in accordance with the invention, in which the output signal AOS of the output line 33 is delivered to an analog-to-digital converter 45 (hereinafter refered to as "A/D converter") and the sampling clock Φ1 is delivered to a clock input terminal CK thereof. The output of said A/D converter 45 enters to a logic circuit 46 and the outputs LCOM1 and LCOM2 of said logic circuit 46 respectively become "HIGH" and "LOW" as described in FIG. 2 if the output signal AOS is kept up between the window reference voltages, and to the contrary they all become "LOW" if said output is larger than said window reference voltages. That is, assuming that the output of the A/D converter 45 consists of eight bits and the arrangement is made so that the outputs LCOM1 and LCOM2 of the logic circuit 46 should be operated as aforementioned in FIG. 2 in response to digital output from the A/D converter 45 which provides an output within the range of the window reference voltages set out by computing the weight of output bits of said A/D converter 45, the circuit of FIG. 9 operates as same as the circuit of FIG. 2. The remaining reference numerals in FIG. 9 are identical to those of the FIG. 2 and all the same operations are carried out.

Figure 10:
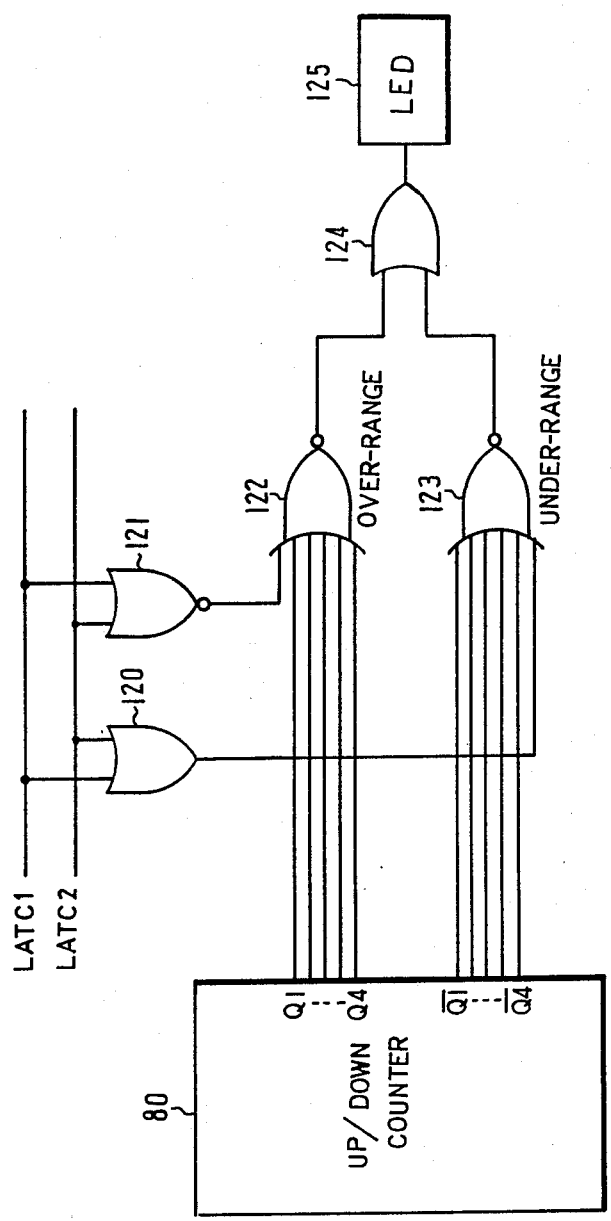
FIG. 10 is a schematic circuit diagram of an under-range and over-range indicator.

FIG. 10 shows a schematic circuit diagram of an under-range and over-range indicator which represents whether or not the output level of the step gain controller is out of the operating range of the automatic gain control system according to the invention. In order to display information stored in a file such as a video file on a cathode ray tube (CRT) displaying device, it may be preferred to employ an AGC system for attaining more clear definition in video signals, wherein there are often malfunctions in the AGC operation, as it travels between over-range or under-range due to the limitation in the AGC operating range if each maximum level of signals differs much from each other. At this time, there is possible to avoid the limitation due to a full counting of the AGC operation by means of displaying the over-range or the under-range, and adequately thereto controlling an initial level of input signal in the AGC operation.

An OR gate 120 and a NOR gate 121 respectively receive the signals LATC1 and LATC2 shown in FIG. 2. The output of said OR gate 120 and the outputs $\overline{Q0}$ to $\overline{Q4}$ of the UP/DOWN counter 80 shown in FIG. 4 are entered to a NOR gate 123. The output of said NOR gate 121 and the outputs Q0 to Q4 of said UP/DOWN counter 80 are entered to a NOR gate 122, and the outputs of said NOR gate 122 and 123 are provided to an OR gate 124 which provides its output to a light-emitting-diode (LED) 125. When all the signals LATC1 and LATC2 are HIGH, the UP/DOWN counter 80 performs a down counting operation. Herein, because the output of the NOR gate 122 becomes HIGH if the outputs Q0 to Q4 become all "0", that is, a full counting, the LED 125 turns on. Also, if the signals LATC1 and LATC2 are all LOW, there is taken the UP counting action. Thus, when the outputs $\overline{Q0}$ to $\overline{Q4}$ become all "0", that is, the full counting, the output of said NOR gate 123 goes HIGH and the diode 125 turns ON. Accordingly, these operations make the under-range or the over-range be displayed.

Referring to the aforementioned description, the invention may be used for a high frequency input signal because it does not employ operational amplifiers and capacitors in order to detect a maximum level of an output signal, but makes control of the gain of the amplifier by means of comparing a sampled voltage value with a reference voltage. Further, it makes possible exact maintenance of the maximum value of an output signal at a fixed level through reducing the window range of the reference voltages because it directly compares the sampled output signal with the reference voltages, and also makes it possible to exclude a malfunction in the automatic gain control operation resulting from the impulse noise by means of using a counter. In the meanwhile, in a digital system that employs analog-to-digital (A/D) converters such as in a digital television receiver or a digital signal processing system, a full scale of the A/D converter is made to be fixed in a constant level, wherein if the maximum value of input signal is larger than full scale, the A/D converter fails to properly convert the input value beyond the full scale and clips the input signal, thereby losing a distinctive quality of the original signal. Also, when the input signal level is much smaller than full scale, the resolution power goes down by more than would occur when an input signal is close to the full scale and thereby could not reproduce a signal close to the original signal. At this time, if the circuit is arranged so that the input to the A/D converter should be entered through the automatic gain control, a signal having a level larger than full scale is made to rapidly decrease so as not to be clipped, and a signal having a much smaller level than full scale is made to slowly increase, whereby the resolution power improves without changing the distinctive quality of the original input signal.

What is claimed is:

1. An automatic gain control system, comprising:
    gain control means for providing an output signal by operating in step mode on an input signal in response to digital data of a data bus;
    comparing means for generating a digital output indicating whether said output signal is within a window reference voltage range;
    means receiving said digital output, for preventing malfunction due to noise by performing a counting operation on the basis of said digital output;
    means for generating a clock pulse and dividing in frequency the clock pulse, whereby there is provided a divided clock pulse during an up counting operation and to the contrary there is provided a non-divided clock pulse during a down counting operator, and generating a reset clock delayed by a specified time interval from said clock pulse generating means;
    latch means adapted to receive and thereby latch an output of said malfunction preventing means; and
    up/down counting and logic means for providing said digital data of said data bus by performing up and down counting operations on the basis of said clock pulse and output of said latch means.

2. The system of claim 1, wherein said comparing means comprises a plurality of comparators each operating upon said output signal and a different reference signal.

3. The system of claim 1, wherein said digital output has a plurality of components and said comparing means comprises a plurality of comparators each operating upon said output signal and a different reference signal to generate a different component of said digital output.

4. The system of claim 1, wherein said comparing means comprises:
    means for converting said output signal into a digital signal; and
    logic means for generating said digital output on the basis of said digital signal.

5. The system of claim 1, wherein said gain control means varies amplitude of said input signal in incremental steps, and said comparing means provides said window reference voltage range with a difference in amplitudes greater than one of said incremental steps.

6. The system of claim 1, wherein said up/down counting and logic means generates said digital data exhibiting a first state when amplitude of said output signal exceeds said window reference voltage range and a second state when said amplitude is less than said window reference voltage range.

7. An automatic gain control system, comprising:
    gain control means for providing an output signal by performing step mode operations on an input signal;
    comparing means for generating a digital output exhibiting different states indicating a relation between amplitude of said output signal and a window reference voltage range by concurrently making a comparison between said output signal and said window reference voltage range;
    malfunction preventing means receiving said digital output, for generating output pulses and for controlling pulse length and period of said output pulses in dependance upon said states of said digital output; and
    up/down counting and logic means for performing up and down counting operations controlling said step mode operations on the basis of said output pulses of said malfunction preventing means.

8. The system of claim 7, wherein said digital output has a plurality of components and said comparing means comprises a plurality of comparators each operating upon said output signal and a different reference signal to generate a different component of said digital output.

9. The system of claim 7, wherein said comparing means comprises:
    means for converting said output signal into a digital signal; and
    logic means for generating said digital output on the basis of said digital signal.

10. The system of claim 7, wherein said gain control means varies amplitude of said input signal in incremental steps, and said comparing means provides said window reference voltage range with a difference in amplitudes greater than one of said incremental steps.

11. The system of claim 7, wherein said up/down counting and logic means generate digital data exhibiting a first state when amplitude of said output signal exceeds said window reference voltage range and a second state when said amplitude is less than said window reference voltage range, and said gain control means performs said step mode operations in dependence upon said digital data.

12. The system of claim 11, wherein said pulse generating means includes means for selectively controlling generation of said output pulses in response to change in said digital output.

13. The system of claim 7, wherein said pulse generating means includes means for selectively controlling generation of said output pulses in response to change in said digital output.

14. The system of claim 7, further comprising:
means, coupled to said counting means, for generating a plurality of clock pulses at frequencies set on the basis of the relation between said output signal and window reference range; and
said counting means perform said counting operations at rates set by said clock pulses.

15. The system of claim 7, wherein said window reference range comprises a plurality of reference signals and said comparing means comprises a plurality of means each for making a comparison between said output signal and a different one of said reference signals, and for generating a digital output indicative of said comparison.

16. The system of claim 15, wherein said malfunction preventing means includes pulse generating means for determining the number of said output pulses on the basis of said digital output.

17. The system of claim 7, wherein said malfunction preventing means includes means for selective termination of generation of said output pulses in response to changes in said digital output.

18. An automatic gain control system, comprising:
gain control means for providing an output signal susceptible to the presence of impulse noise components exhibiting a first range of periods and a second range of periods exceeding said first range of periods in duration, and for performing step mode operations on an input signal to provide said output signal;
comparing means for operating upon output signal and generating a digital output indicating relations between said output signal and a window reference range;
means for generating a plurality of clock pulses at frequencies set on the basis of the relation between said output signal and window reference range;
malfunction preventing means receiving said digital output, for generating output pulses characterized by periods exceeding said first range in dependence upon said digital output; and,
counting means for performing counting operations controlling said step mode operations on the basis of said output pulses generated by said malfunction preventing means and at rates set by said clock pulses.

19. The system of claim 18, wherein said malfunction preventing means includes pulse generating means for setting pulse length and period of said output pulses.

20. The system of claim 19, wherein said pulse generating means includes means for selectively controlling generation of said output pulses in response to change in said digital output.

21. The system of claim 18, wherein said pulse generating means includes means for selectively controlling generation of said output pulses in response to change in said digital output.

22. The system of claim 18, wherein said window reference range comprises a plurality of reference signals and said comparing means comprises a plurality of means each for making a comparison between said output signal and a different one of said reference signals, and for generating a digital output indicative of said comparison.

23. The system of claim 22, wherein said malfunction preventing means includes means for selectively controlling generation of said output pulses in response to changes in said digital output.

24. The system of claim 22, wherein said malfunction preventing means includes pulse generating means for setting pulse length and said periods of said output pulses.

25. The system of claim 24, wherein said malfunction preventing means includes means for selectively controlling generation of said output pulses in response to changes in said digital output.

26. The system of claim 18, wherein said malfunction preventing means includes pulse generating means for determining the number of said output pulses on the basis of said digital output.

27. An automatic gain control system, comprising:
gain control means for providing an output signal susceptible to the presence of impulse noise components exhibiting a first range of periods, for performing step mode operations on an input signal to provide said output signal;
means operating upon and making a comparison of said output signal with a window reference range, for generating output pulses having periods exceeding said first range of periods while said output signal exhibits particular relations with said window reference range during said comparison;
means for generating clock pulses at frequencies set on the basis of said relations of said output signal and window reference range; and
counting means for performing counting operations controlling said set mode operations on the basis of said output pulses generated by said output pulse generating means and at rates set by said clock pulses.

28. The system of claim 27, wherein said gain control means varies amplitude of said input signal in incremental steps, and said output pulse generating means provides said window reference voltage range with a difference in amplitudes greater than one of said incremental steps.

29. The system of claim 27, wherein said window reference range comprises a plurality of reference signals and said output pulse generating means comprises a plurality of comparator means each for making a comparison between said output signal and a different one of said reference signals, and for generating a digital output indicative of said comparison.

30. The system of claim 29, wherein said output pulse generating means includes means for selectively controlling generation of said output pulses in response to changes in said relations.

31. The system of claim 27, wherein said output pulse generating means includes means for selectively controlling generation of said output pulses in response to changes in said relations.

32. The system of claim 27, wherein said output pulse generating means includes pulse generating means for determining the number of said output pulses on the basis of said comparison.

33. The system of claim 27, wherein said output pulse generating means operates upon and concurrently makes a comparison of said output signal and a plurality of reference signals providing said window reference range.

34. The system of claim 27, wherein said output pulse generating means comprises:
  means for converting said output signal into a digital signal; and
  logic means operating upon and concurrently making comparisons between said digital signal and a plurality of components providing said window reference range.

* * * * *